(12) United States Patent
Nemecek et al.

(10) Patent No.: US 10,788,438 B2
(45) Date of Patent: Sep. 29, 2020

(54) REMOTE SENSOR SYSTEM

(71) Applicant: WaterBit, Inc., San Jose, CA (US)

(72) Inventors: Craig Nemecek, Seattle, WA (US);
William Koutny, Santa Clara, CA (US); Manu Pillai, San Jose, CA (US);
Andrew Wright, Fremont, CA (US);
Leif Chastaine, San Jose, CA (US)

(73) Assignee: WaterBit, Inc., San Jose, CA (US)

( * ) Notice: Subject to any disclaimer, the term of this patent is extended or adjusted under 35 U.S.C. 154(b) by 58 days.

(21) Appl. No.: 16/251,085

(22) Filed: Jan. 18, 2019

(65) Prior Publication Data

US 2020/0232939 A1    Jul. 23, 2020

(51) Int. Cl.

| G01N 27/22 | (2006.01) |
|---|---|
| G06F 1/16 | (2006.01) |
| H03K 19/00 | (2006.01) |
| H02J 7/35 | (2006.01) |
| G01K 7/02 | (2006.01) |
| H01L 31/02 | (2006.01) |

(52) U.S. Cl.
CPC ........... *G01N 27/223* (2013.01); *G01K 7/021* (2013.01); *G06F 1/16* (2013.01); *H01L 31/02008* (2013.01); *H02J 7/35* (2013.01); *H03K 19/0016* (2013.01)

(58) Field of Classification Search
CPC ............. G01N 27/223; G06F 1/16; H02J 7/35
See application file for complete search history.

(56) References Cited

U.S. PATENT DOCUMENTS

| 2007/0139164 | A1 | 6/2007 | O'Toole et al. |
| 2008/0282817 | A1* | 11/2008 | Breed .................. G06F 3/0238 73/865.9 |
| 2013/0145826 | A1* | 6/2013 | Richarz .................. E03B 7/003 73/49.1 |
| 2013/0175983 | A1 | 7/2013 | Partovi et al. |
| 2014/0148899 | A1 | 5/2014 | Fehr et al. |
| 2014/0266785 | A1* | 9/2014 | Miller ............... H04W 12/0608 340/870.04 |
| 2017/0082568 | A1 | 3/2017 | Pillai et al. |

FOREIGN PATENT DOCUMENTS

WO    2012/010676 A1    1/2012

OTHER PUBLICATIONS

PCT/US2020/014458, ISR and WO dated Apr. 16, 2020.

* cited by examiner

*Primary Examiner* — Alvaro E Fortich
(74) *Attorney, Agent, or Firm* — Rimon Law

(57) ABSTRACT

An agricultural sensing system includes multiple sensor and/or actuator modules configured to communicate with a relay unit. The sensor and/or actuator modules are powered using solar energy and contain no batteries. The modules feature sleep modes in which some circuits are placed in a low energy mode to conserve energy and remove the need for batteries. Communications to or from the relay unit are optionally timed to avoid interference between transmissions from different sensor and/or actuator modules. The relay units are configured to relay sensor data and send commands to the sensor and/or actuator modules.

14 Claims, 2 Drawing Sheets

REMOTE SENSOR SYSTEM

BACKGROUND

Field of the Invention

The invention is in the field of remote sensing, for example, sensing of conditions relevant to agriculture.

Related Art

Sensors for agriculture can detect conditions such as moisture and temperature. However, it has been difficult to design a sensor that is practical to use in open fields.

SUMMARY

Various embodiments of the invention comprise a sensor system including a plurality of sensor modules wirelessly connected to a relay unit. Each of the sensor modules includes one or more sensors configured to detect environmental and agricultural system conditions, such as those relevant to agriculture. Each of the sensor modules include features configured to facilitate their use in agricultural fields. For example, they are hermetically sealed and include energy management and data collection elements that allow for extended use without external electrical power or internal batteries.

Each of the sensor modules is configured to communicate with a relay unit using short-range radio signals. The relay unit is in communication with a server configured to process data generated at the plurality of sensor modules. The relay unit is configured to communicate with the server using a longer-range communication channel such as a cellular network, a telephone line, and/or the internet. Typically, the server is configured for a user to review summaries of the collected data. Optionally, the server may be configured to control systems, e.g., water valves, so as to take actions in response to the collected data.

Various embodiments of the invention comprise a sensor system comprising: a sensor module including a hermetically sealed housing, a memory configured to store an identifier of the sensor module, solar cell configured to generate a current, energy storage capacitor configured to store electrical energy, charging circuit configured charge the capacitor using the current, and to produce a sensor output representative of the measurement, a clock circuit configured to generate a clock signal, a first radio circuit powered by the capacitor and configured to generate a first radio signal including the sensor output and the identifier, the radio signal being at a first radio frequency, a control circuit configured to determine when to make measurements using the sensor and when to transmit the first radio signal using the first radio circuit, sleep circuit configured to place the first radio circuit and the control circuit in a sleep or hibernate mode, the sleep circuit being responsive to the clock signal; and a relay unit including a second radio circuit configured to receive radio signals from multiple sensor modules, the received radio signals including the first radio signal, and to transmit a second radio signal at a second radio frequency, the first radio frequency being different than the second radio frequency.

Various embodiments of the invention comprise a method of gathering sensor data, the method comprising: generating a current using a solar cell, the solar cell being disposed in a hermetically sealed housing; charging a capacitor using the current; receiving a clock signal; waking a sensing circuit to an awake mode from a sleep mode using the clock signal; receiving sensor data from the sensing circuit; waking a radio circuit from an awake mode to a sleep mode; sending the sensor data and an identifier of the sensor module using the radio circuit; turning off the sensing circuit; turning off the radio circuit; receiving the sent sensor data at a relay unit; and relaying the sensor data from the relay unit to a server. The method optionally further includes receiving a command from the relay unit, the command being configured to change a time the sensor or actuator circuit is turned on.

DETAILED DESCRIPTION

Figure 1:
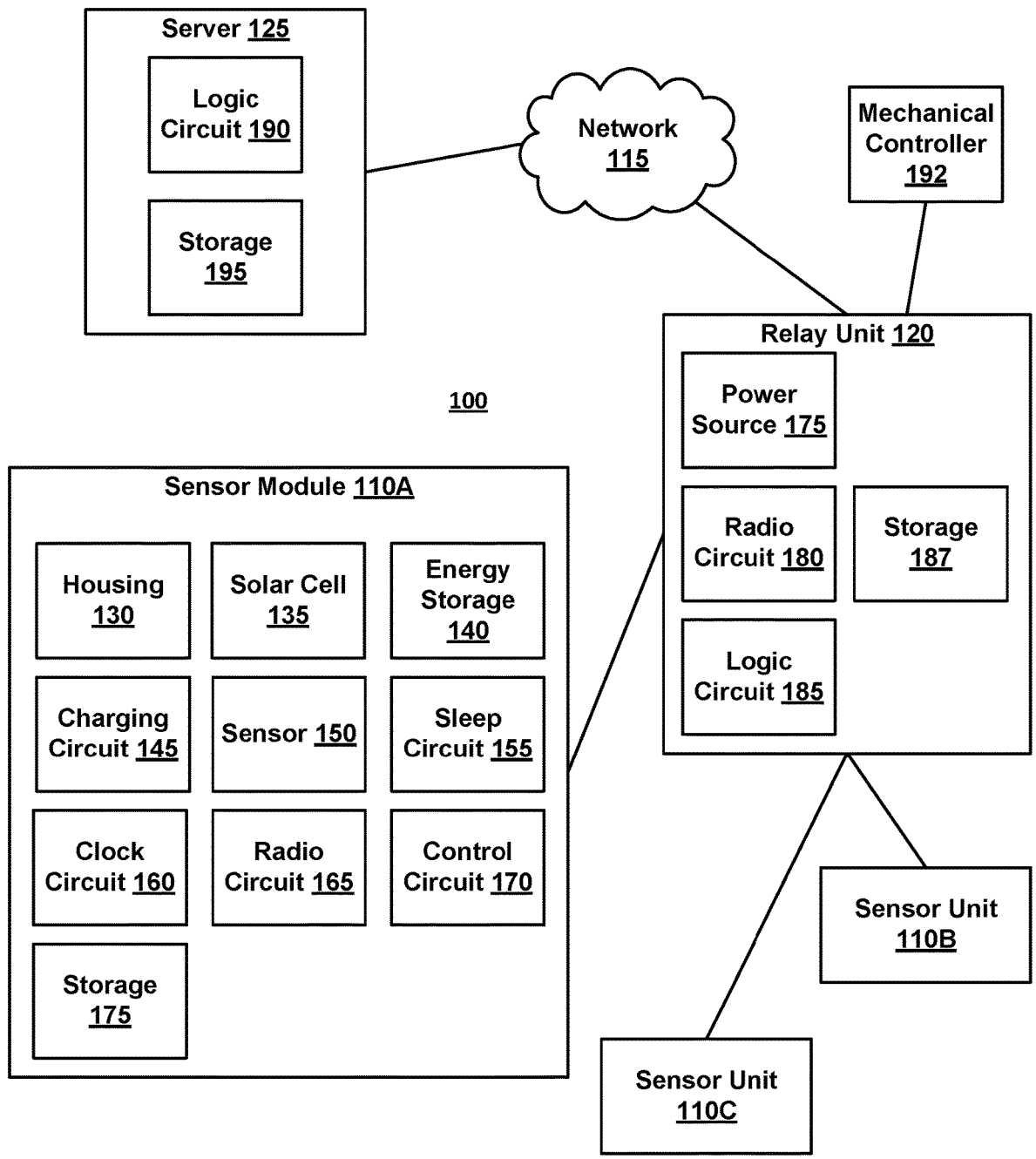
FIG. 1 illustrates a sensor system, according to various embodiments of the invention.

FIG. 1 illustrates a Sensor System 100, according to various embodiments of the invention. These embodiments include a plurality of Sensor Modules 110, individually referenced 110A, 110B, 110C, etc. Each of Sensor Modules 110 is in radio communication with a Relay Unit 120. Relay Unit 120 may be in communication with one, two, three or more of Sensor Modules 110. Relay Unit 120 is configured to communicate with a Server 125 via a Network 115. Network 115 can include wired and/or wireless links. For example, Network 115 can include the internet, a wired telephone system, WiFi transceivers, Ethernet, and/or the like. Each of Sensor Modules 110, Relay Unit 120 and Server 125 include circuits configured to perform specific functions as described elsewhere herein.

In use, Sensor System 100 may be used to monitor conditions at an agricultural facility covering a wide area. For such an application multiple Relay Units 120 may be used, each of the Relay Units 120 supporting multiple Sensor Modules 110. This support may include receiving sensor data, receiving status data, receiving identity data, sending commands, and/or the like. The received data may be processed on Relay Unit 120 and/or relayed to Server 125. In practice Sensor Modules 110 are distributed over the area to be monitored and a sufficient number of Relay Units 120 are placed so that each of the Sensor Modules 110 are within communication range of at least one Relay Unit 120.

During placement, the location of each of Sensor Modules 110 is typically recorded using a GPS measurement and a unique identifier of each particular Sensor Module 110A, 110B, etc. Thus, sensor data obtained from each respective sensor module can be associated with a particular GPS location.

As a representative example of Sensor Modules 110, Sensor Module 110A includes a Housing 130. Housing 130 is configured to hold other elements of Sensor Module 110A and is typically hermetically sealed. For example, in some embodiments Housing 130 includes a plastic case and an O-ring seal. Housing 130 is also typically manufactured of a material configured to survive mechanical stresses as may be experienced in an agricultural field, e.g., able to endure being struck by farming equipment.

Sensor Module 110A further includes a Solar Cell 135. Solar Cell 135 is configured to generate electrical energy, e.g., an electrical current, to be stored in an Energy Storage 140. Solar Cell 135 is disposed within Housing 130 such that it is exposed to sunlight. Energy Storage 140 can include a capacitor, and/or the like. Some embodiments include multiple Solar Cells 135 disposed such that at least one Solar Cell 135 faces up when Sensor Module 110A is laid on the ground. A Charging Circuit 145 is configured to receive the electrical energy from Solar Cell 135 and to use this electrical energy to charge Energy Storage 140.

Sensor Module 110A further includes one or more Sensor 150. Sensor 150 is configured to detect environmental conditions such as temperature, incident light, humidity, soil moisture, pH, soil conductivity, and/or the like. Sensor 150 may be configured to detect environmental conditions above or below the soil of an agricultural field. For example, one embodiment of Sensor 150 may be disposed to measure air temperature while others are disposed to measure soil temperature and/or soil moisture at various depths. Sensor 150 is configured to generate an electrical signal and may include a transducer configured to convert an analog signal into a digital signal.

An amount of light received by Solar Cell 135 and or Sensor 150 is optionally used to infer an amount of foliage above Sensor Module 110A and, thereby, to infer an amount of plant growth. Sensor 150 optionally includes wavelength dependent light sensors.

Sensor Module 110A further includes a Sleep Circuit 155 configured to place elements of Sensor Module 110A in a low power mode. Sleep Circuit 155 is optionally responsive to a Clock Circuit 160 configured to measure time periods in which the elements of Sensor Module 110A are in a low power (sleep) mode or a higher power (awake) mode. These elements consume more of energy stored in Energy Storage 140 in the higher power mode relative to the lower power mode.

Sensor Module 110A further includes a Radio Circuit 165. Radio Circuit 165 is powered by Energy Storage 140, e.g., by a capacitor. Radio Circuit 165 is configured to generate a radio signal including the output of Sensor 150 and an identifier of Sensor Module 110A. In various embodiments, this radio signal is sent via Bluetooth, WiFi or other wireless standards.

Radio Circuit 165 is optionally further configured to receive a radio signal from Relay Unit 120. The received radio signal can include commands configured to control the operation of Sensor Module 110A. For example, Radio Circuit 165 may receive commands configured to control how often and/or at what times Sleep Circuit 155 is configured to turn on Radio Circuit 165 to receive signals or communicate outputs of Sensor 150, and/or to turn on Sensor 150 to make sensor measurements. Received commands may further be configured to: set a time for Clock Circuit 160, set which sensor measurements to make using Sensor 150, set a time period between sensor measurements, set a time to make sensor measurements, control actuators, receive diagnostics, configure system state, update firmware, and other system commands as desired.

Radio Circuit 165 is typically under the control of Sleep Circuit 155. As such, Radio Circuit 165 can be turned on and off for short periods of time. As discussed further elsewhere herein, the timing of these short periods is configurable.

Sensor Module 110A optionally further includes a Control Circuit 170, configured to process commands received via Radio Circuit 165. Control Circuit 170 typically includes an integrated circuit configured determine when to make measurements using Sensor 150 and/or when to send or receive radio signals. In some embodiments, Control Circuit 170 is configured to interpret received commands and store resulting operational data in memory, e.g., Storage 175. For example, commands to take a temperature measurement every 10 minutes and to transmit the resulting temperature data at 6:40 AM, 2 PM and 10 PM may be received from Relay Unit 120. As a result, Control Circuit 170 stores the 10 minute time period and the transmission times in Storage 175 as operational parameters, which can be read by Sleep Circuit 155.

Sensor Circuit 150 further includes a Storage 175 configured to store digital data. Storage 175 can include electronic memory circuits, read only memory, flash memory, static memory, and/or the like. Storage 175 includes at least a digital identifier of Sensor Module 110A, e.g., a unique serial number. Storage 175 may also be configured for storing data generated by Sensors 150, configuration information (e.g., times to switch between low and higher power modes and/or radio frequencies). Storage 175 is optionally configured to store an identifier, e.g., serial number, of Sensor Module 110A.

Relay Unit 120 is configured to receive sensor data from multiple Sensor Modules 110 and to relay the received data to Server 125. Communication from Relay Unit 120 to Server 125 can take place via a wired and/or wireless connection of Network 115. For example, in various embodiments Relay Unit 120 is configured to communicate via wired, cellular, satellite, Bluetooth, and/or WiFi connections. Typically, Relay Unit 120 is further configured to receive commands from Server 125, e.g., configuration commands and/or commands to be relayed to one or more of Sensor Modules 110. Each Relay Unit 120 can be configured to relay data and/or commands to or from at least 5, 10, 20 or 40 of Sensor Modules 110.

Relay Unit 120 includes a Power Source 178, a Radio Circuit 180, a Logic Circuit 185 and a Storage 187. Relay Unit 120 optionally further includes embodiments of Solar Cell 135, Housing 120, Sensor 150, Sleep Circuit 155, Clock Circuit 150, and/or Storage 175. Power Source 178 can include a solar cell, a battery, a capacitor, a transformer, and/or an AC power line. Radio Circuit 180 is typically configured to communicate using at least two or more different radio frequencies and/or protocols. For example, Radio Circuit 180 may be configured to communicate via both WiFi and cellular telephone networks. Radio Circuit 180 may be configured for both local and longer distance communication. For example, in some embodiments, WiFi is used to communicate locally, e.g., to Sensor Modules 110, while cellular telephone networks are used to communicate to Server 125 via Network 115. Radio Circuit 180 optionally includes two different antennae (not shown) configured to communicate RF signals in different frequency ranges.

Logic Circuit 185 is configured to control other electronic elements of Relay Unit 120. For example, Logic Circuit 185 may be configured to determine when data should be received from Sensor Module 110A, and/or commands should be sent to Sensor Module 110A. Logic Circuit 185 may be configured for adding additional Sensor Modules 110 to Sensor System 100 and to configured communication (e.g., configuration timing) with these units such that communications with different members of Sensor Modules 110 are set to occur at different times. (Thus, not interfering with each other.)

Logic Circuit 185 is optionally further configured to determine when to communicate data received from Sensor Modules 110 to Server 125. For example, data may be sent on a periodic basis, when Storage 187 is becomes full, and/or when triggered by certain values in the data, e.g., a moisture value below a preset threshold. In such embodiments, Logic Circuit 185 may be configured to process data received from Sensor Modules 110. This processing can include the performance of statistical analysis, e.g., calculation of a mean or average, or detection of variance in data received from different members of Sensor Module 110.

Logic Circuit 185 is optionally further configured to send commands and/or receive a status from an optional Mechanical Controller 192. Mechanical Controller 192 can include an electronic irrigation valve assembly, greenhouse vent controls, an electronic water pump assembly, lighting controls, and/or the like. For example, in some embodiments Mechanical Controller 192 includes a digital logic circuit configured to receive a command from Relay Unit 120 and to activate an electrical relay in response, the electrical relay being configured to control a motor of an automated electronic irrigation valve. Commands to control mechanical elements of Sensor System 100 can be generated by Relay Unit 120 and/or Server 125. Mechanical Controller 192 is optionally configured to communicate to Sensor Module 110 directly, rather than via Relay Unit 120.

In some embodiments, Logic Circuit 185 is configured to associate data received from Sensor Module 110A with a location of Sensor Module 110A. For example, Logic Circuit 185 may associate moisture data received from Sensor Module 110 with a particular location in a farm field and, thus, use moisture data received from multiple Sensor Modules 110 to generate a map of moisture levels within the farm field.

Storage 187 is configured to store data received from Sensor Modules 110, e.g., data generated using Sensor 150. Storage 187 is configured to store data received from multiple Sensor Modules 110. Storage 187 is optionally further configured to store data processed using Logic Circuit 185, identifiers of Sensor Modules 110, configuration data for Relay Unit 120 and/or Sensor Modules 110, locations of Sensor Modules 110, and/or the like. Storage 187 may be configured thus by selection of data structures and/or memory locations.

Server 125 includes at least a Logic Circuit 190 and a Storage 195. Server 125 typically further includes communication and power circuits (not shown) as would normally be found in a computing device. Server 125 can include one or more computing devices connected via Network 115, and optionally distributed in different locations. Logic Circuit 190 can be configured to perform any of the operations discussed herein with respect to Control Circuit 170 and/or Logic Circuit 185. In addition, Logic Circuit 190 may be configured to provide a user interface configured for a user to view, manipulate, and/or otherwise process data generated by Sensor Module 110 (or data derived therefrom). For example, Logic Circuit 190 may be configured to generate a visual map indicating areas in a field of high moisture or low moisture. A user interface generated by Logic Circuit 190 is optionally configured for a user to set criteria for controlling Mechanical Controller 192.

Storage 195 may be configured to store any of the data stored by Storage 175 or Storage 187. Further, Storage 195 may be configured to store data received from multiple Relay Units 120 and/or associated with multiple user accounts.

Figure 2:
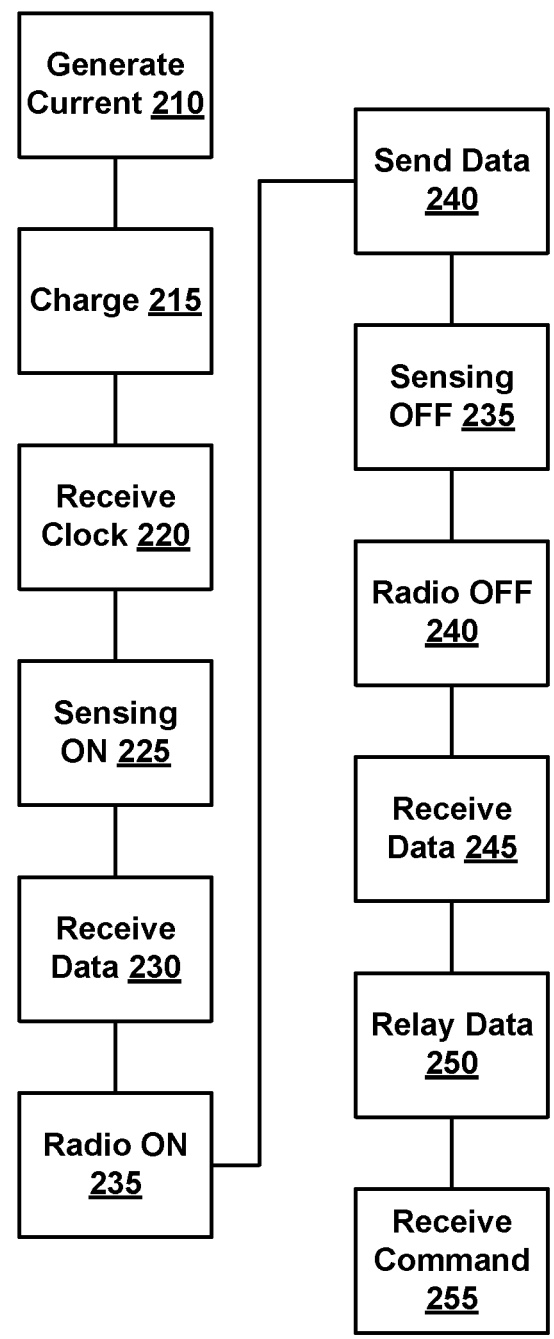
FIG. 2 illustrates methods of detecting agricultural conditions, according to various embodiments of the invention.

FIG. 2 illustrates methods of detecting agricultural conditions, according to various embodiments of the invention. These methods are optionally performed using the various embodiments of Sensor System 100 illustrated in FIG. 1. The Steps illustrated in FIG. 2 are optionally performed in alternative orders.

In a Generate Current Step 210 current is generated using Solar Cell 135. In a Charge Step 215 the current generated using Solar Cell 135 is used to charge Energy Storage 140. The current may also be used to operate Clock Circuit 160 and/or Sleep Circuit 155. In some embodiments, the fraction of the generated current used to charge Energy Storage 140 is varied depending on the amount of current generated and/or the amount of power stored in Energy Storage 140.

In a Receive Clock Step 220 a clock signal generated by Clock Circuit 160 is received by Sleep Circuit 155. The clock signal may include a square wave generated at a known frequency or may include a time value, such as a date and/or time of day. The clock signal is configured for Sleep Circuit 155 to perform specific operations at specific times and/or after specific delays.

In a Sensing ON Step 225 Sensor 150 is woken from a sleep mode to an awake mode by Sleep Circuit 155. Sensing ON Step 225 is performed in response to the clock signal receive by Sleep Circuit 155 in Receive Clock Step 220.

In a Receive Data Step 230 sensor data generated using Sensor 150 is received within Sensor Module 110A. The received data is optionally stored in Storage 175. The received data can include any of the types of data that Sensor 150 is configured to generate. For example, in various embodiments the received data includes temperature data, soil moisture data, and/or humidity data.

In a Radio ON Step 235 Radio Circuit 165 is woken from a sleep mode to an awake mode. Radio ON Step 235 is performed by Sleep Circuit 155 in response to Clock Circuit 160, the receipt of sensor data in Receive Data Step 230, and/or the presence of sensor data within Storage 175. In some embodiments Sensor Module 10A uses less than ⅒ of the energy in the sleep mode relative to the amount, used when not in the sleep mode.

In a Send Data Step 240 Radio Circuit 165 is used to send the sensor data received in Receive Data Step 230. The data is sent to Relay Unit 120 using a first radio frequency and/or a first wireless protocol. Send Data Step 240 optionally further includes sending a unique identifier of Sensor Module 110A to Relay Unit 120. Send Data Step 240 optionally further includes using Radio Circuit 165 to listen for commands sent to Sensor Module 110A by Relay Unit 120.

In a Sensing OFF Step 235 Sensor 150 is turned OFF, e.g., returned from the awake mode to the sleep mode. Note that Sensing OFF Step 235 optionally takes place prior to Send Data Step 240. Sensing OFF Step 235 is performed using Sleep Circuit 155, optionally in response to the clock signal received from Clock Circuit 160. Sensing OFF Step 235 is optionally performed in response to successful completion of Receive Data Step 230.

In a Radio OFF Step 240 Radio Circuit 165 is turned OFF, e.g., returned from the awake mode to the sleep mode. Radio OFF Step 240 may be performed by Sleep Circuit 155 in response to Clock Circuit 160 and/or in response to successful completion of Send Data Step 140.

The term "OFF" as used with respect to Sensor 150 and Radio Circuit 165 is meant to indicate that the reading of sensor data is OFF and transmission of RF signals is OFF. As discussed elsewhere herein, in the sleep mode some power is optionally still consumed by these circuits.

In a Receive Data Step 245 sensor data, generated using Sensor 150 and communicated using Radio Circuit 165, is received by Relay Unit 120 using Radio Circuit 180. This data is received at a first radio frequency and/or using a first communication protocol. The data received by Relay Unit 120 is optionally processed using Logic Circuit 185. For example, the received data may be stored in Storage 187, averaged, compared to a threshold, used to activate Mechanical Controller 192, and/or otherwise analyzed. The data received in Receive Data Step 245 typically includes a unique identifier of Sensor Module 110A, or the member of Sensor Modules 110 from which the data was received. The identifier is optionally stored or associated with the received data, such that the received data can be later identified as having come from a particular member of Sensor Modules 110. In some embodiments, the received identifier is used to further associate the received data with a particular location.

In a Relay Data Step 250, the sensor data received from one or more of Sensor Modules 110, and/or a result of processing this data, is relayed to Server 125 via Network 115. In some embodiments, a result of processing the sensor data, e.g., an average, is relayed to Server 125. Typically, the relayed data includes identifiers of the members of Sensor Modules 110, and/or corresponding locations at which the data was generated. Relay Data Step 250 typically includes use of an RF signal having a second radio frequency signal and/or second communication protocol. The second radio frequency and/or second communication protocol being different from the first radio frequency and/or first communication protocol.

The data relayed to Server 125 is optionally processed using Logic Circuit 190 and/or stored in Storage 195. For example, the data may be presented to a user in a map or in a tabular form. At Server 125 the data may be associated with one or more user accounts.

In an optional Receive Command Step 255 a command is received by Sensor Module 110A. The command may be directed specifically to Sensor Module 110A either by including the unique identifier of Sensor Module 110A and/or by sending the command at a previously scheduled time. For example, Sensor Module 110A may be scheduled to wake up Radio Circuit 165 at 5:00 PM and listen for a command. When a radio transmission (including an identifier and command) is received at the proper time, the command is confirmed by checking for the presence of the unique identifier of Sensor Module 110A in the received transmission. As discussed elsewhere herein, the received command may be used to configure Sensor Module 110A in a variety of ways using Control Circuit 170. For example, the received command may be used to change a time Sensor 150 is turned on.

In an optional Control Valve Step 260 Mechanical Controller 192 is activated. Optionally, this control is based on sensor data received from one or more Sensor Modules 110A. In one example, Control Valve Step 260 includes opening a water valve based on sensor data indicating that more soil moisture is needed at a particular location. Mechanical Controller 192 can be controlled from Sever 125 or Relay Unit 120.

Several embodiments are specifically illustrated and/or described herein. However, it will be appreciated that modifications and variations are covered by the above teachings and within the scope of the appended claims without departing from the spirit and intended scope thereof. For example, the systems and methods discussed herein may be adapted to either indoor or outdoor agriculture; or for raising crops and/or livestock.

The embodiments discussed herein are illustrative of the present invention. As these embodiments of the present invention are described with reference to illustrations, various modifications or adaptations of the methods and or specific structures described may become apparent to those skilled in the art. All such modifications, adaptations, or variations that rely upon the teachings of the present invention, and through which these teachings have advanced the art, are considered to be within the spirit and scope of the present invention. Hence, these descriptions and drawings should not be considered in a limiting sense, as it is understood that the present invention is in no way limited to only the embodiments illustrated.

Computing systems referred to herein can comprise an integrated circuit, a microprocessor, a personal computer, a server, a distributed computing system, a communication device, a network device, or the like, and various combinations of the same. A computing system may also comprise volatile and/or non-volatile memory such as random-access memory (RAM), magnetic media, optical media, nano-media, a hard drive, a compact disk, a digital versatile disc (DVD), and/or other devices configured for storing analog or digital information, such as in a database. Storage discussed herein can include any such types of memory, and may be configured to store specific types of data by way of data structures and/or memory address allocation. The various examples of logic noted herein comprise hardware, firmware, or software stored on a computer-readable medium, or combinations thereof. A computer-readable medium, as used herein, expressly excludes paper. Circuits discussed herein include diodes, resisters, transistors, digital logic gates, digital microprocessors, printed circuit boards, semiconductor chips, and/or the like. Computer-implemented steps of the methods noted herein can comprise a set of instructions stored on a computer-readable medium that when executed cause the computing system to perform the steps. A computing system programmed to perform particular functions pursuant to instructions from program software is a special purpose computing system for performing those particular functions. Data that is manipulated by a special purpose computing system while performing those particular functions is at least electronically saved in buffers of the computing system, physically changing the special purpose computing system from one state to the next with each change to the stored data.

What is claimed is:

1. A sensor system comprising:
    a sensor module including
        a hermetically sealed housing,
        a memory configured to store an identifier of the sensor module,
        a solar cell configured to generate a current,
        an energy storage capacitor configured to store electrical energy,
        a charging circuit configured charge the capacitor using the current,
        a sensor configured to measure temperature, humidity or moisture, and to produce a sensor output representative of the measurement,
        a clock circuit configured to generate a clock signal,
        a first radio circuit powered by the capacitor and configured to generate a first radio signal including the sensor output and the identifier, the radio signal being at a first radio frequency,
        a control circuit configured to determine when to make measurements using the sensor and when to transmit the first radio signal using the first radio circuit,
        a sleep circuit configured to place the first radio circuit and the control circuit in a sleep mode, the sleep circuit being responsive to the clock signal; and
    a relay unit including:
        a second radio circuit configured to receive radio signals from multiple sensor modules, the received radio signals including the first radio signal, and to transmit a second radio signal at a second radio frequency, the first radio frequency being different than the second radio frequency.

2. The system of claim 1 wherein the first radio circuit is further configured to receive commands from the relay unit and the control circuit is configured to operate the sensor responsive to the received commands.

3. The system of claim 1, wherein the first radio circuit and the control circuit use much less energy in the sleep mode relative to the amount they use when they are not in the sleep mode.

4. The system of claim 1, wherein the relay unit further comprises a memory configured to store sensor outputs received from multiple sensor modules.

5. A method of gathering sensor data, the method comprising:
- generating a current using a solar cell, the solar cell being disposed in a hermetically sealed housing;
- charging a capacitor using the current; receiving a clock signal;
- waking a sensor to its awake mode of the sensor from its sleep mode of the sensor, using the clock signal; receiving sensor data from the sensor;
- waking a radio circuit from a sleep mode of the radio circuit to an awake mode of the radio circuit;
- sending the sensor data and an identifier of a sensor module using the radio circuit; turning off the sensor to place the sensor in the sleep mode of the sensor;
- turning off the radio circuit to place the radio circuit in the sleep mode of the raio circuit;
- receiving the sent sensor data at a relay unit; and relaying the sensor data from the relay unit to a server.

6. The method of claim 5, further comprising controlling an actuator or mechanical controller based on the sensor data.

7. The method of claim 5, further comprising receiving a command from the relay unit, the command being configured to change a time the sensor is turned on.

8. The method of claim 5, further comprising controlling a water valve.

9. The method of claim 5, wherein the sensor data includes temperature data or humidity data.

10. The method of claim 5, wherein the radio circuit is woken from the sleep mode of the radio circuit using the clock signal.

11. The method of claim 5, wherein, in the sensor sleep mode of the sensor, an energy use per minute of the sensor is less than $\frac{1}{10}$ of an energy use per minute of the sensor in the awake mode of the sensor.

12. The method of claim 5, wherein in the radio circuit sleep mode of the radio circuit the radio circuit uses less than $\frac{1}{10}$ of energy per minute than is used in the radio circuit awake mode of the radio circuit.

13. The method of claim 5, wherein the sending of the sensor data is timed to avoid interference from radio signals from other sensor modules.

14. The method of claim 5, wherein the sensor data is sent from the relay unit as a set of sensor data received from multiple sensor modules.

* * * * *